(12) United States Patent
Mokaberi

(10) Patent No.: US 8,628,712 B2
(45) Date of Patent: Jan. 14, 2014

(54) MISALIGNMENT MANAGEMENT

(75) Inventor: Babak Mokaberi, Cedar Park, TX (US)

(73) Assignee: Molecular Imprints, Inc., Austin, TX (US)

( * ) Notice: Subject to any disclaimer, the term of this patent is extended or adjusted under 35 U.S.C. 154(b) by 241 days.

(21) Appl. No.: 12/553,645

(22) Filed: Sep. 3, 2009

(65) Prior Publication Data

US 2010/0102470 A1    Apr. 29, 2010

Related U.S. Application Data

(60) Provisional application No. 61/108,750, filed on Oct. 27, 2008.

(51) Int. Cl.
*B28B 11/08* (2006.01)

(52) U.S. Cl.
USPC .......................... 264/293; 264/40.1; 425/385

(58) Field of Classification Search
USPC ................................. 264/293, 40.1; 425/385
See application file for complete search history.

(56) References Cited

U.S. PATENT DOCUMENTS

| | | | | |
|---|---|---|---|---|
| 6,847,433 B2 * | 1/2005 | White et al. | ..................... | 355/72 |
| 6,929,762 B2 * | 8/2005 | Rubin | ............................. | 264/40.1 |
| 7,027,156 B2 * | 4/2006 | Watts et al. | .................... | 356/401 |
| 2005/0271955 A1 * | 12/2005 | Cherala et al. | .................. | 430/22 |
| 2008/0026305 A1 * | 1/2008 | Wu et al. | ............................ | 430/22 |
| 2008/0095878 A1 * | 4/2008 | Bailey et al. | .................. | 425/385 |

FOREIGN PATENT DOCUMENTS

WO   WO 2007123249 A2 *  11/2007 ................ G03F 9/00

* cited by examiner

*Primary Examiner* — Amjad Abraham
(74) *Attorney, Agent, or Firm* — Cameron A. King; Michael D. Carter; Fish & Richardson P.C.

(57) ABSTRACT

A method of determining overlay error between a template and a substrate using placement of template features and placement of substrate features in one or more images. Estimated distortion of the template and/or substrate may be determined using the overlay error. One or more forces acting on the template and/or substrate may be varied based on the estimated distortion for subsequent nano-lithography imprinting. Additionally, bias may be introduced in subsequent imprinting steps based on overlay performance.

11 Claims, 4 Drawing Sheets

MISALIGNMENT MANAGEMENT

CROSS-REFERENCE TO RELATED APPLICATIONS

This application claims the benefit under 35 U.S.C. §119(e)(1) of U.S. Provisional Application Ser. No. 61/108,750, filed Oct. 27, 2008, which is incorporated by reference herein in its entirety.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate, therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Exemplary imprint lithography processes are described in detail in numerous publications, such as U.S. Patent Publication No. 2004/0065976, U.S. Patent Publication No. 2004/0065252, and U.S. Pat. No. 6,936,194, all of which are hereby incorporated by reference.

An imprint lithography technique disclosed in each of the aforementioned U.S. patent publications and patent includes formation of a relief pattern in a polymerizable layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that the present invention may be understood in more detail, a description of embodiments of the invention is provided with reference to the embodiments illustrated in the appended drawings. It is to be noted, however, that the appended drawings illustrate only typical embodiments of the invention, and are therefore not to be considered limiting of the scope.

DETAILED DESCRIPTION

Figure 1:
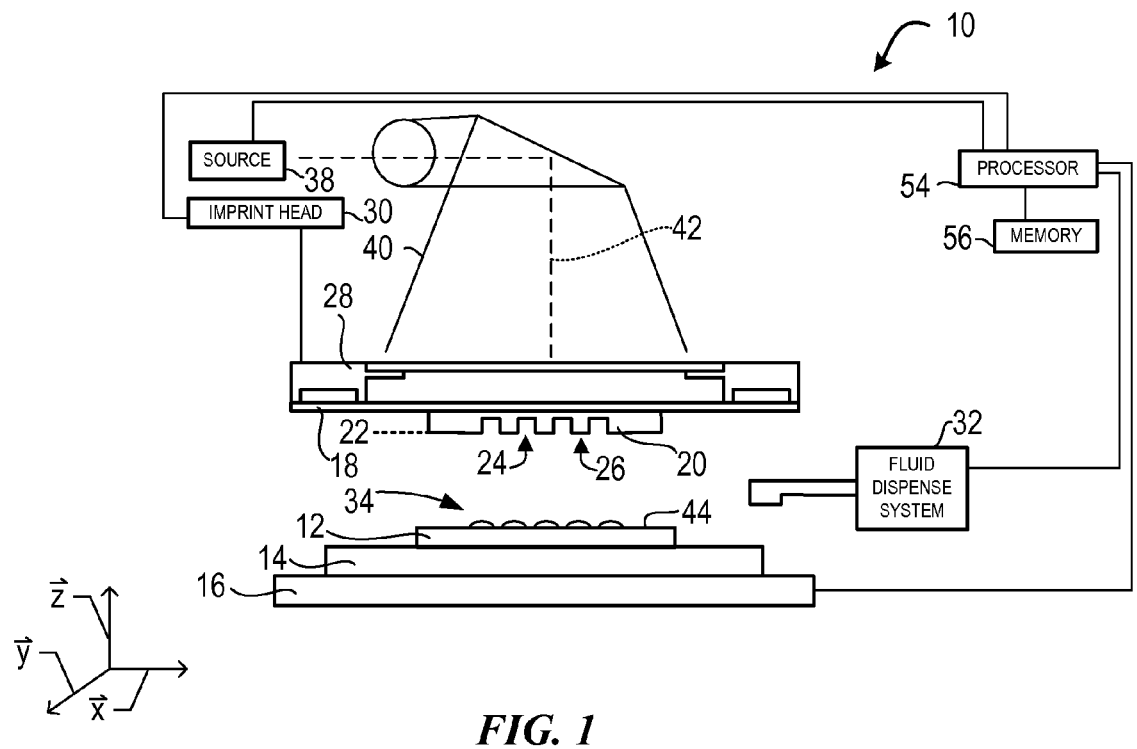
FIG. 1 illustrates a simplified side view of a lithographic system in accordance with one embodiment of the present invention.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electromagnetic, and/or the like. Exemplary chucks are described in U.S. Pat. No. 6,873,087, which is hereby incorporated by reference.

Substrate 12 and substrate chuck 14 may be further supported by stage 16. Stage 16 may provide motion about the x-, y-, and z-axes. Stage 16, substrate 12, and substrate chuck 14 may also be positioned on a base (not shown).

Spaced-apart from substrate 12 is a template 18. Template 18 generally includes a mesa 20 extending therefrom towards substrate 12, mesa 20 having a patterning surface 22 thereon. Further, mesa 20 may be referred to as mold 20. Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations. Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electromagnetic, and/or other similar chuck types. Exemplary chucks are further described in U.S. Pat. No. 6,873,087, which is hereby incorporated by reference. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit polymerizable material 34 on substrate 12. Polymerizable material 34 may be positioned upon substrate 12 using techniques such as drop dispense, spin-coating, dip coating, chemical vapor deposition (CVD), physical vapor deposition (PVD), thin film deposition, thick film deposition, and/or the like. Polymerizable material 34 may be disposed upon substrate 12 before and/or after a desired volume is defined between mold 20 and substrate 12 depending on design considerations. Polymerizable material 34 may comprise a monomer as described in U.S. Pat. No. 7,157,036 and U.S. Patent Publication No. 2005/0187339, all of which are hereby incorporated by reference.

Figure 2:
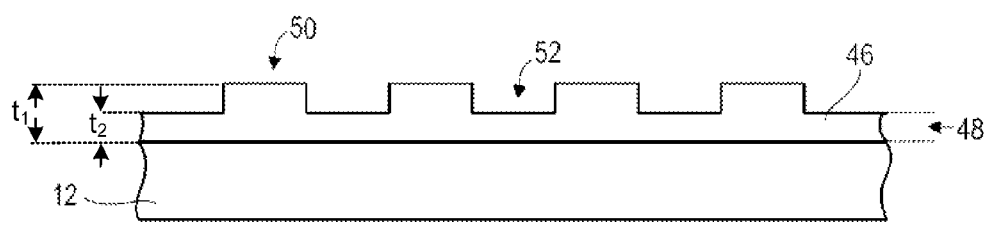
FIG. 2 illustrates a simplified side view of the substrate shown in FIG. 1 having a patterned layer positioned thereon.

Referring to FIGS. 1 and 2, system 10 may further comprise an energy source 38 coupled to direct energy 40 along path 42. Imprint head 30 and stage may be configured to position template 18 and substrate 12 in superimposition with path 42. System 10 may be regulated by a processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by polymerizable material 34. For example, imprint head 30 may apply a force to template 18 such that mold 20 contacts polymerizable material 34. After the desired volume is filled with polymerizable material 34, source 38 produces energy 40, e.g., broadband ultraviolet radiation, causing polymerizable material 34 to solidify and/or cross-link conforming to shape of a surface 44 of substrate 12 and patterning surface 22, defining a patterned layer 46 on substrate 12. Patterned layer 46 may comprise a residual layer 48 and a plurality of features shown as protrusions 50 and recessions 52, with protrusions 50 having thickness $t_1$ and residual layer having a thickness $t_2$.

The above-mentioned system and process may be further employed in imprint lithography processes and systems referred to in U.S. Pat. No. 6,932,934, U.S. Patent Publication No. 2004/0124566, U.S. Patent Publication No. 2004/0188381, and U.S. Patent Publication No. 2004/0211754, each of which is hereby incorporated by reference.

Ascertaining a desired alignment between template 18 and substrate 12 may aid in the facilitation of pattern transfer between template 18 and substrate 12. To facilitate alignment, an optical imaging system utilizing alignment marks on the template 18 and/or substrate 12 may be used with one alignment mark of the pair being disposed on the template 18, and the remaining alignment mark being positioned on the substrate 12.

The optical imaging system may include a light source focusing light upon the substrate 12. For example, the optical imaging system may be configured to use the light source to focus alignment marks lying in different focal planes to a single focal plane. An optical sensor may then detect variations of the reflected light. Examples of alignment marks and optical systems for use in imprint lithography processes are described in detail in U.S. Pat. No. 7,136,150, and U.S. Pat. No. 7,070,405, and U.S. Pat. No. 6,916,584, all of which are hereby incorporated by reference.

During the imprinting process, template 18 may be aligned to the corresponding substrate 12 prior to solidification and/or cross-linking of polymerizable material 34 within each field. Misalignment between template 18 and substrate 12 may be separated into eight correctional components: translation (x, y), rotation, magnification (x, y), trapezoidal (x, y), and orthogonal.

Distortion of Template and Substrate

Figure 3:
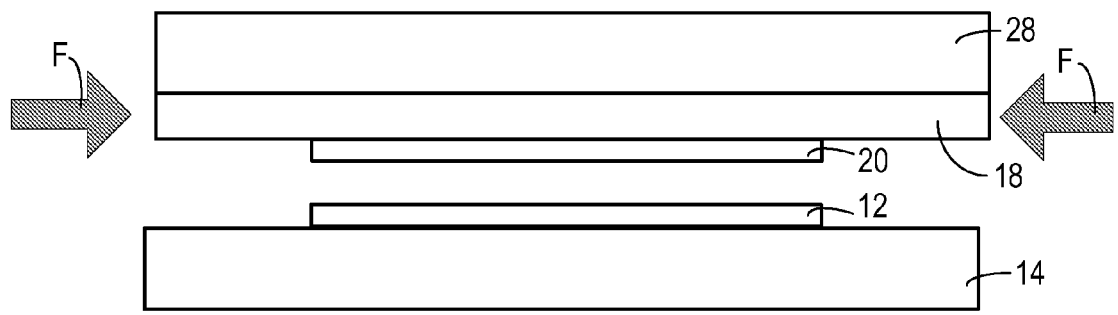
FIG. 3 illustrates a simplified side view of a template spaced apart from a substrate, the template and substrate having forces acting thereon.

Forces F may distort template 18 and/or substrate 12 resulting in misalignment of template 18 and substrate 12. These forces may include, but are not limited to, the forces provided by substrate chuck 14 and chuck 28, forces resulting from the interaction between mask 22 and substrate surface 44, magnification actuators situated about template 18 and/or the like. For example, FIG. 3 illustrates forces F, due to magnification actuators. Other exemplary forces are described in U.S. Pat. No. 7,298,456, U.S. Pat. No. 7,170,589, U.S. patent application Ser. No. 11/142,834, and U.S. patent application Ser. No. 11/687,902, all of which are hereby incorporated by reference. By identifying the distortion that may be substantially attributed to such forces F, misalignment between template 18 and substrate 12 due to such forces F may be corrected.

The placement of features 24 and 26 of template 18 and the corresponding features of substrate 12 may already have some distortions. Identification of these distortions may be measured by using images 60 of template 18 and/or substrate 12. Images herein include any physical likeness or representation including, but not limited to optical counterparts produced by reflection, refraction, passage of rays. Image representation may be substantially similar to a representation of template 18 and/or substrate 12. Additionally, multiple image representations may be used to identify distortions. For example, such images 60 may be captured by the optical imaging system, an external camera, and/or the like.

Figure 4:
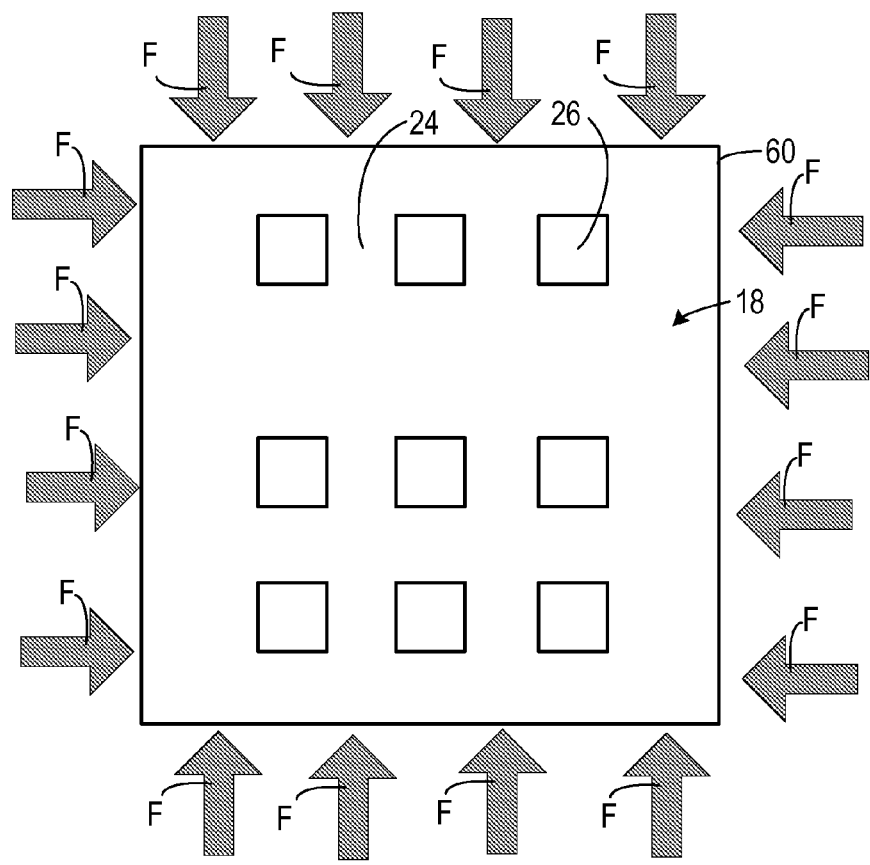
FIG. 4 illustrates an exemplary image of a template.

The distortions in each of the template 18 and/or substrate 12 may be identified prior to imprinting, during imprinting, or subsequent to imprinting. Image(s) 60 may be measured to provide placement of features 24 and 26 and/or 50 and 52 respectively. For example, image(s) 60 may be measured using a high magnification optical systems and/or interferometer stages. FIG. 4 illustrates image 60 providing feature placement of features 24 and 26 of template 18.

Placement of features 24 and 26 of template 18 and features 50 and 52 of substrate 12 may be considered field vectors. Field vectors herein referred to two-dimensional vector function of (x, y) of location in the template 18 and substrate 12, respectively. For example, placement of features 24 and 26 of template 18 may be referred to in terms of:

$$\vec{M}(x,y)$$

and, placement of features 50 and 52 of substrate 12 may be referred to in terms of:

$$\vec{W}(x,y).$$

Misalignment between template 18 and substrate 12 may be separated into eight correctional components: translation (x, y), rotation, magnification (x, y), trapezoidal (x, y), and orthogonal. It should be noted that translation (x, y) and rotational errors may be removed from these terms as compensation for translation and rotational errors may be corrected by movement of stage 16 during the alignment process. As such, magnification (x, y), orthogonal, trapezoidal (x, y), and/or high order residual terms may remain substantially unchanged.

Figure 6:
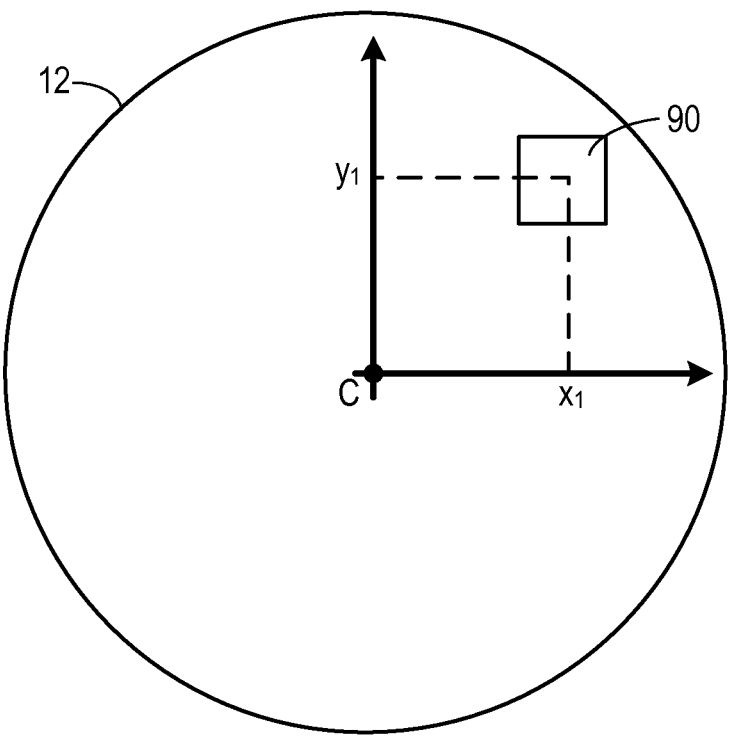
FIG. 6 illustrates a top down view of a substrate having a field positioned thereon.

Referring to FIGS. 4 and 6, subsequent to alignment and/or imprinting of at least one field 90 of substrate 12, overlay errors between template 18 and substrate 12 may be measured. Overlay errors may be referred to in terms of:

$$\vec{O}_i(x,y)$$

wherein i indicates the field number of substrate 12.

Forces F may provide distortion of template 18 and/or substrate 12. For example, affected forces F on the template 18 during the imprint at field number i may be referred to hereinafter as $F_i$. For forces acting on template 18, forces $F_i$ may be represented as the M dimensional vector, wherein each component indicates an acting force that may have substantial influence on distortion of template 18. At each time instant, forces $F_i$ may be balanced. As such, overlay error of each field 90 may contain 1) a set of distortions that are influenced by forces $F_i$, 2) placement of features 50 and 52 of substrate 12 shown as $\vec{W}(x,y)$, and 3) placement of features 24 and 26 of template 18 shown as $\vec{M}(x,y)$. Thus, overlay errors may be represented with the relationship formulated as:

$$\vec{O}_i(x,y) = \vec{M}(x,y) - \vec{W}_i(x,y) + \vec{D}(F_i) + \vec{\epsilon}_i$$

wherein D is the distortion of template 18 due to forces $F_i$ and $\epsilon$ is modeling error. By subtracting the overlay errors from two consecutive imprinted fields i and i+1, this equation may be rephrased as:

$$\vec{O}_{i+1}(x,y) - \vec{O}_i(x,y) = -(\vec{W}_{i+1}(x,y) - \vec{W}_i(x,y)) + \vec{D}(F_i + \delta F_i) - \vec{D}(F_i)$$

wherein $\delta F_i$ is the difference between the exerted (applied) force values at field i and i+1. With the assumption that the following ratio is much smaller than unity, i.e.:

$$\frac{\|\delta F_i\|}{\|F_i\|} \ll 1$$

the Taylor series may be used for the final two terms of the equation to provide:

$$\vec{O}_{i+1}(x,y) - \vec{O}_i(x,y) = -\left(\vec{W}_{i+1}(x,y) - \vec{W}_i(x,y)\right) + \delta F_i \frac{\partial \vec{D}(F)}{\partial F}$$

and therefore:

$$\delta F_i \frac{\partial \vec{D}(F)}{\partial F} = \vec{O}_{i+1}(x,y) - \vec{O}_i(x,y) + \left(\vec{W}_{i+1}(x,y) - \vec{W}_i(x,y)\right)$$

Using known terms $$\frac{\partial \vec{D}(F)}{\partial F}$$

may be estimated using a Least Square Estimation method providing an estimation of distortion of template 18. Using this estimation of distortion, forces $F_i$ may be increased or decreased to reduce distortion of template 18 during alignment. As one skilled in the art will appreciate, the above formulation may be provided for distortion of substrate 12 as well.

Figure 5:
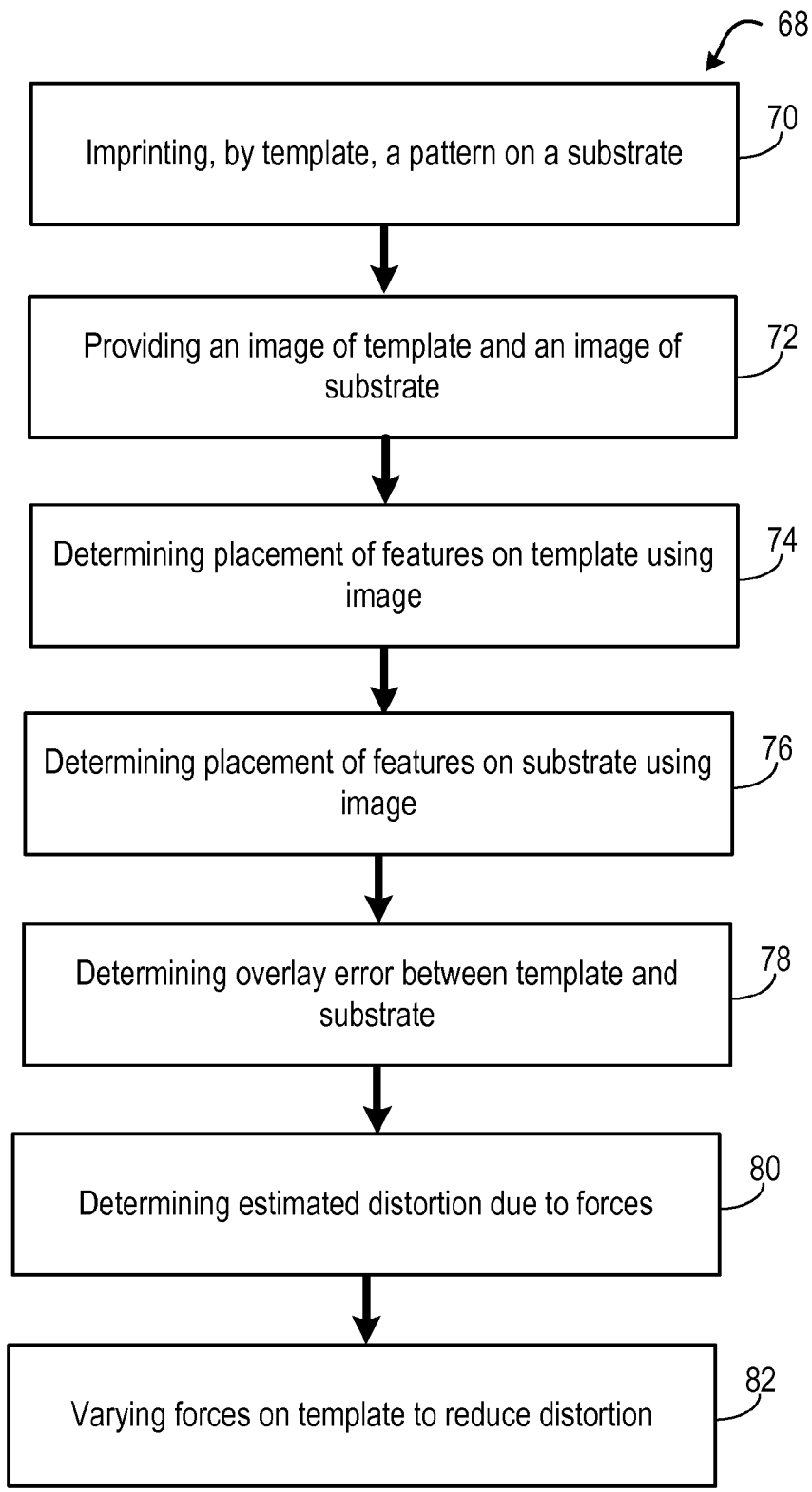
FIG. 5 illustrates a flow chart of an exemplary method for reducing distortion of a template during alignment and imprinting.

FIG. 5 illustrates a flow chart of an exemplary method 68 for reducing distortion of template 18 during alignment and imprinting. In a step 70, template 18 may imprint a pattern on substrate 12. In a step 72, a first image 60 of template 18 and a second image 60 of substrate 12 may be provided. In a step 74, placement of features 24 and 26 within first image 60 of template 18 may be determined. In a step 76, placement of features 50 and 52 within second image 60 of substrate 12 may be determined. In a step 78, overlay error between template 18 and substrate 12 may be determined. In a step 80, estimated distortion of template 18 due to forces F may be determined according to the process described above. In a step 82, forces F may be increased or decreased to reduce distortion of template 18 during subsequent imprinting steps as described in relation to FIGS. 1 and 2.

Feed-Forwarding

As previously discussed, misalignment between template 18 and substrate 12 may be separated into eight correctional components: translation (x, y), rotation, magnification (x, y), trapezoidal (x, y), and orthogonal. Reduction of the absolute values of each of these components may reduce misalignment between template 18 and substrate 12.

Referring to FIGS. 4 and 6, generally, substrate 12 may be imprinted with a pattern by template 18. Substrate 12 may comprise a plurality of metrology marks substantially uniformly scattered within each field 90 of substrate 12. Overlay performance may be determined in relation to the metrology marks on substrate 12. Based on the overlay performance, a bias may be introduced for each term in subsequent imprinting by template 18.

Induced distortions from template 18, substrate 12, temperature, and the like may induce various types of distortions into features 50 and 52 of field 90 of substrate 12. FIG. 6 illustrates field 90 of substrate 12. Each field 90 of substrate 12 may be defined by the correctional terms $X_i$ and $Y_i$ (translations), $\theta_i$ (rotation), $Sx_i$ and $Sy_i$ (magnification), $Tx_i$ and $Ty_i$ (trapezoidal), and $SK_i$ (orthogonal), wherein i indicates field number. These terms may be measured from in-field metrology marks substantially uniformly scattered throughout each field 90 of substrate 12 and may be molded with the relationship formulated as:

$$C_i = \sum_{0 \leq m,n < N} a_{mn}^c x_i^m y_i^n$$

$$i = 1, \ldots M$$

$$C_i \in \{X_i, Y_i, \Theta_i, Sx_i, Sy_i, Tx_i, Ty_i, Sk_i\}$$

in which N indicates the polynomial order, M indicates the number of fields 90 per substrate 12, m and n are the exponents (power), and $a_{mn}^c$ is a coefficient specific to exponent m and n and a correctional term C (m, n and C are index for $a_{mn}^c$, not exponent). Using a least square fit, an estimate of correction may be determined by estimating $a_{mn}^c$ for each term. The estimate of correction may be used as a bias and may be introduced for subsequent imprinting by template 18.

Figure 7:
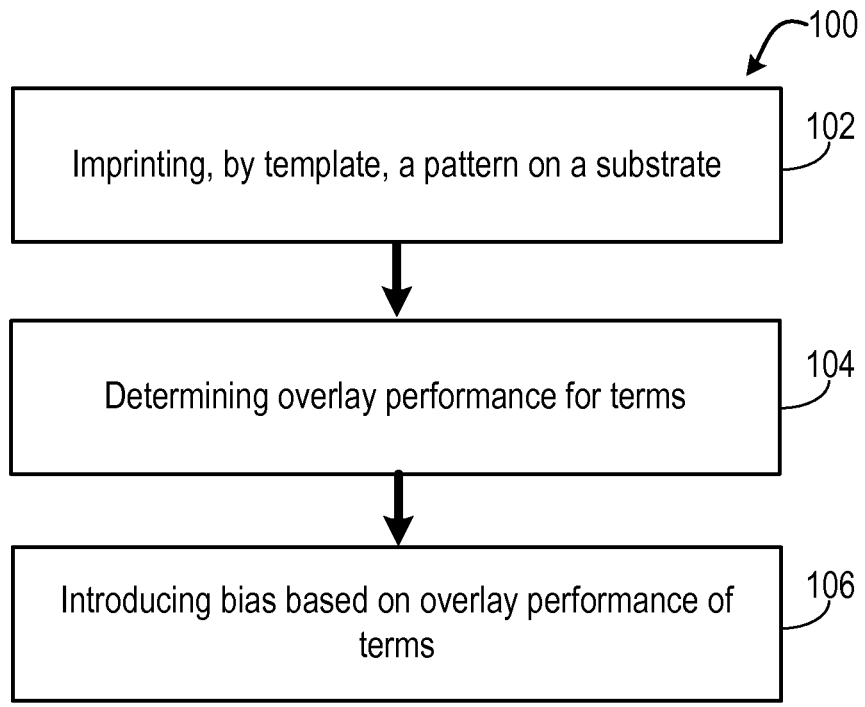
FIG. 7 illustrates a flow chart of an exemplary method for reducing misalignment between template and substrate using feed forwarding.

FIG. 7 illustrates a flow chart of an exemplary method 100 for reducing misalignment by introducing bias. In a step 102, substrate 12 may be imprinted with a pattern of features 50 and 52 by template 18. Substrate 12 may comprise a plurality of metrology marks substantially uniformly scattered within each field 90 of substrate 12. In a step 104, overlay performance within each field 90 may be determined for terms including translations, rotation, magnification, trapezoidal, orthogonal alignment. For example, overlay performance may be determined based on location relative to metrology marks. In a step 106, a bias may be introduced for each term for subsequent imprinting by template 18 based on overlay performance.

Biases for each field are calculated from the algorithm described above with location $x_i$, $y_i$ of field 90 and the estimated coefficients $a_{mn}^c$. As such, prior to imprinting each field 90, 8 biases $\{X_i, Y_i, \Theta_i, Sx_i, Sy_i, Tx_i, Ty_i, Sk_i\}$ may be introduced into the alignment process. These biases are $X_i$ and $Y_i$ (translations), $\theta_i$ (rotation), $Sx_i$ and $Sy_i$ (magnification), $Tx_i$ and $Ty_i$ (trapezoidal), and $SK_i$ (orthogonal) calculated from the algorithm above.

What is claimed is:
1. A method, comprising:
   providing an imprint lithography template having a patterning surface with at least one template feature;
   providing a first image of the imprint lithography template;
   for each field of two consecutive fields of a first substrate:
      imprinting a patterned layer on the first substrate using the imprint lithography template, the template subjected to a plurality of balanced forces arrayed around the perimeter of the template,
      providing a second image of the first substrate having at least two substrate features defined by the imprinted patterned layer,
      determining a placement of the template feature using the first image,
      determining a placement of the substrate features using the second image,
      determining an overlay error between the template and the first substrate using the placement of the template feature and the placement of the substrate features, the overlay error comprising a magnification, trapezoidal and orthogonal overlay error;

calculating distortion $\vec{D}$ of the template according to a relationship $\partial\vec{D}(F)/\partial F=\{[\vec{O}_{i+1}(x,y)-\vec{O}_i(x,y)+[\vec{W}_{i+1}(x,y)-\vec{W}_i(x,y)]\}/\delta F_i$, where $\partial\vec{D}(F)/\partial F$ is determined using a Least Square Estimation, $O_{i+1}$ is the overlay error associated with a second field of the two consecutive fields, $O_i$ is the overlay error associated with a first field of the two consecutive fields, $W_{i+1}$ is the placement of the substrate features associated with the second field, $W_i$ is the placement of the substrate features associated with the first field, and $F_i$ are the plurality of balanced forces;

varying one or more of the arrayed perimeter forces applied to the template based on the distortion of the template so as to reduce template distortion and thereby reduce the magnification, trapezoidal and orthogonal overlay error; and, imprinting a subsequent patterned layer on a field on a second substrate using the template while subjected to the varied force.

2. The method of claim 1, wherein the first substrate and the second substrate are the same substrate.

3. The method of claim 1, wherein the force applied to the template is increased during alignment of the second substrate and the template.

4. The method of claim 1, wherein the force applied to the template is decreased during alignment of the second substrate and the template.

5. The method of claim 1, further comprising:
   determining a second estimated distortion of the first substrate using the overlay error; and,
   varying at least one force applied to the second substrate based on the second estimated distortion.

6. The method of claim 1, wherein the first image and the second image include substantially similar features.

7. The method of claim 1, wherein the first image and the second image are different images.

8. The method of claim 1, wherein at least one image is provided using a magnification optical system.

9. The method of claim 1, wherein at least one image is provided using an interferometer stage.

10. The method of claim 1, wherein the first image is a compilation of images.

11. The method of claim 1, wherein the second image is a compilation of images.

* * * * *